(12) United States Patent
Helot et al.

(10) Patent No.: US 6,331,934 B1
(45) Date of Patent: Dec. 18, 2001

(54) COMPUTER DOCKING STATION WITH ANTI-THEFT LOCKING MECHANISMS FOR REMOVABLE COMPONENTS

(75) Inventors: Jacques H. Helot, San Mateo, CA (US); Michael D. Derocher, Corvallis, OR (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/071,429

(22) Filed: May 1, 1998

(51) Int. Cl.[7] ................ H05K 5/00; H05K 7/00
(52) U.S. Cl. ........................... 361/686; 361/683
(58) Field of Search .................... 361/686, 683, 361/724, 727, 681; 312/223.1, 223.2

(56) References Cited

U.S. PATENT DOCUMENTS

| | | | |
|---|---|---|---|
| 5,535,093 | * 7/1996 | Noguchi et al. | 361/686 |
| 5,561,589 | * 10/1996 | Mesfin et al. | 361/686 |
| 5,687,592 | * 11/1997 | Penniman et al. | 70/14 |
| 5,692,400 | 12/1997 | Bilven et al. | 70/58 |
| 5,805,412 | * 9/1998 | Yanagisawa et al. | 361/686 |
| 5,818,691 | * 10/1998 | McMahan et al. | 361/686 |
| 5,864,294 | * 1/1999 | Hsu et al. | 340/635 |
| 5,948,074 | * 9/1999 | Ninomiya | 710/2 |

* cited by examiner

Primary Examiner—Leo P. Picard
Assistant Examiner—Tung Minh Bui

(57) ABSTRACT

A computer docking station has an anti-theft locking mechanism that prevents theft of PC cards and other removable components (removable drives, batteries, etc.) mounted in the docking station and a portable computer docked therein. The locking mechanism is mechanically moveable between locked and unlocked positions. In the locked position, the locking mechanism at least partially covers the removable components to prevent their removal. In the unlocked position, the locking mechanism is withdrawn to allow removal of the components. The locking mechanism is preferably configured for use with an existing tether lock (e.g., a Kensington lock) used to secure the docking station and/or computer. The lock secures the locking mechanism in the locked position to protect the components.

16 Claims, 8 Drawing Sheets

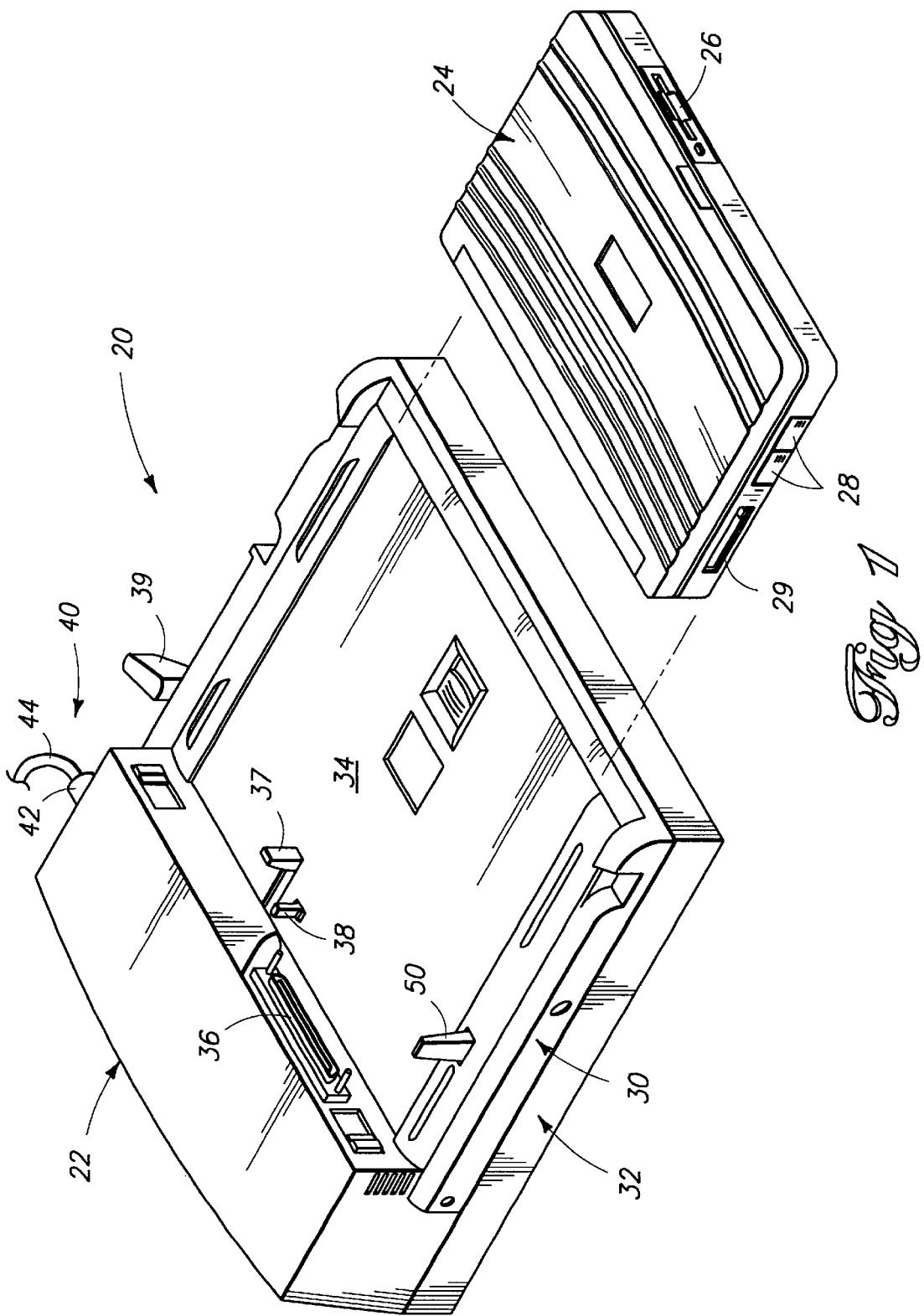

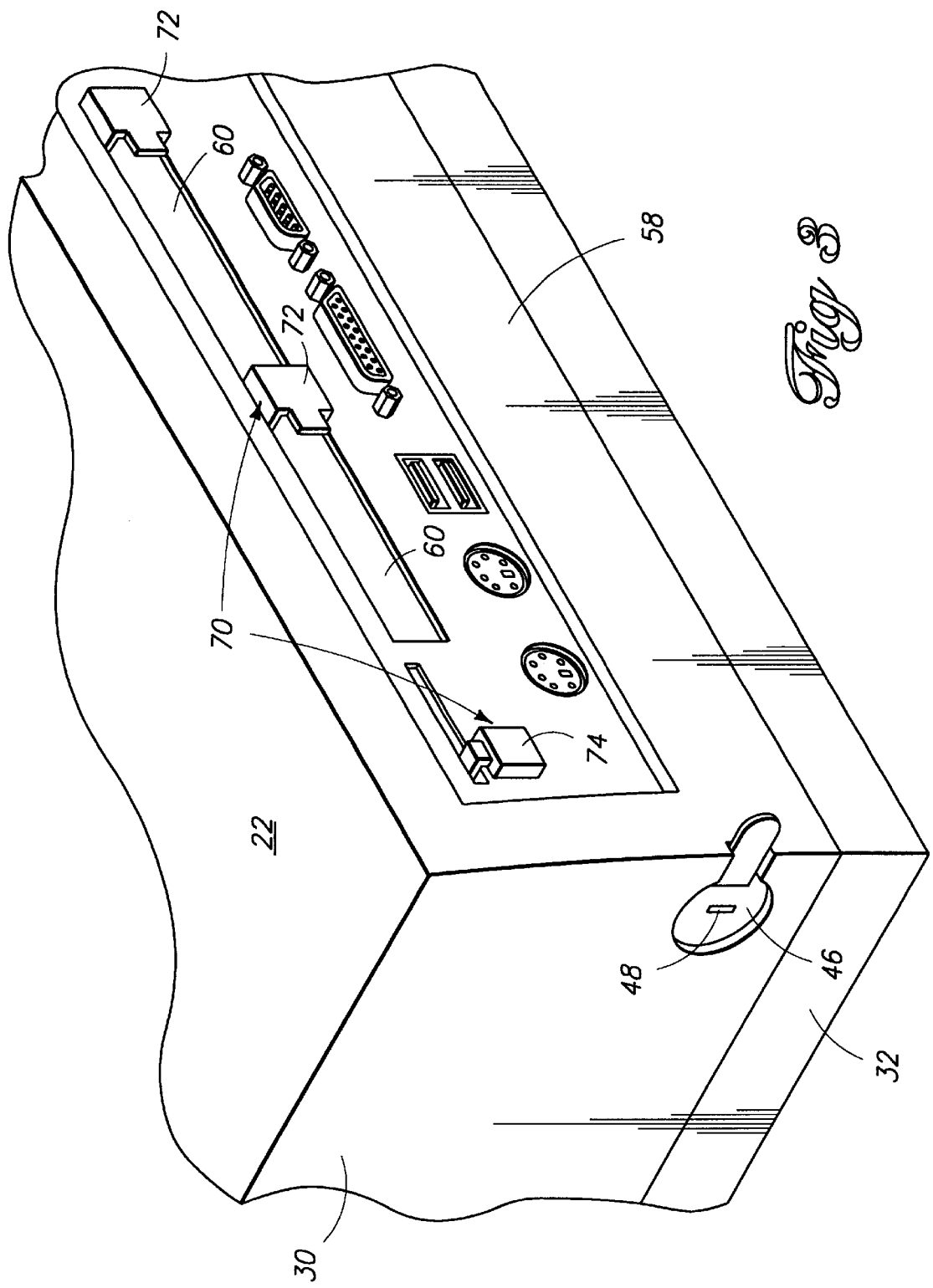

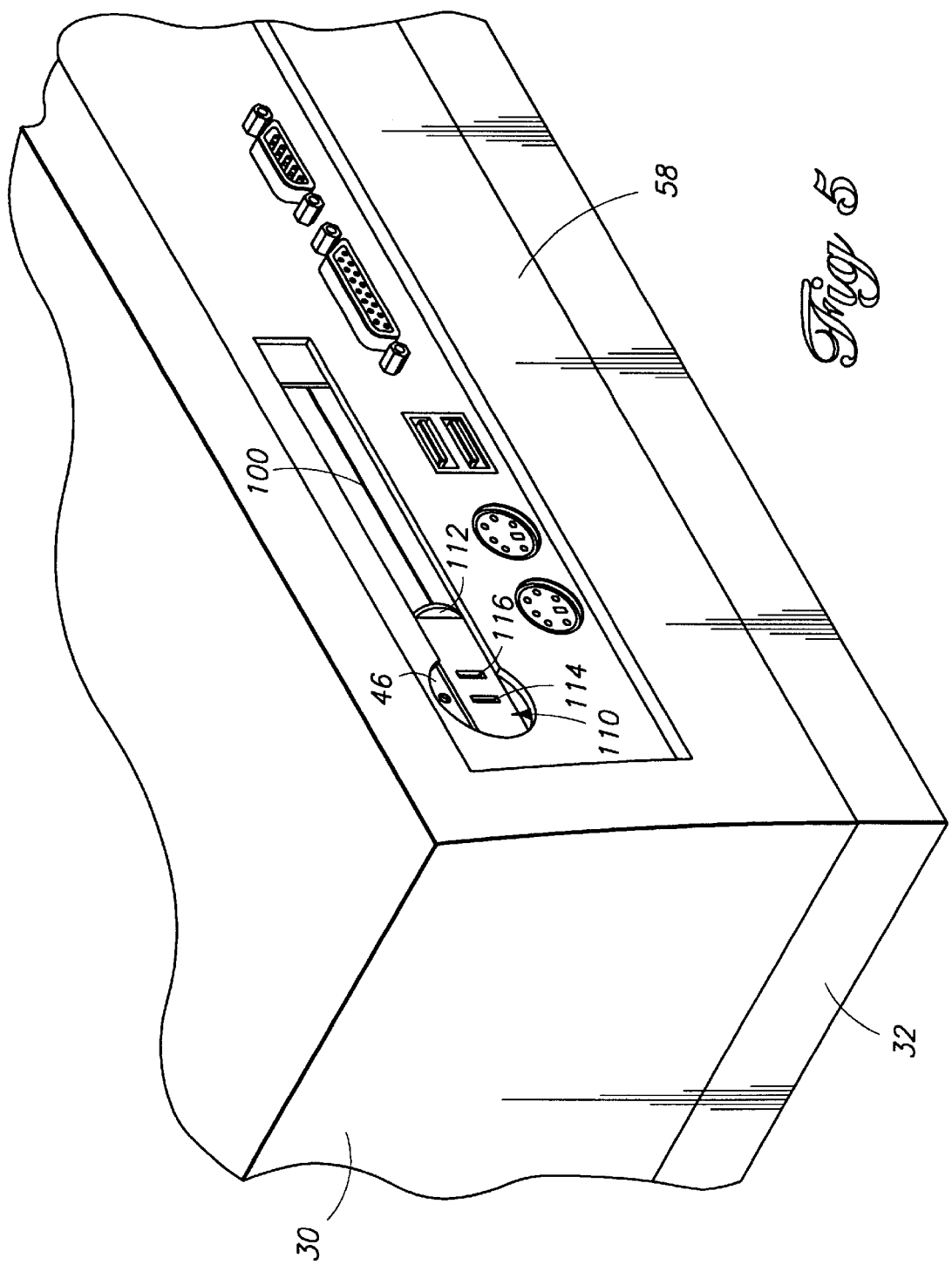

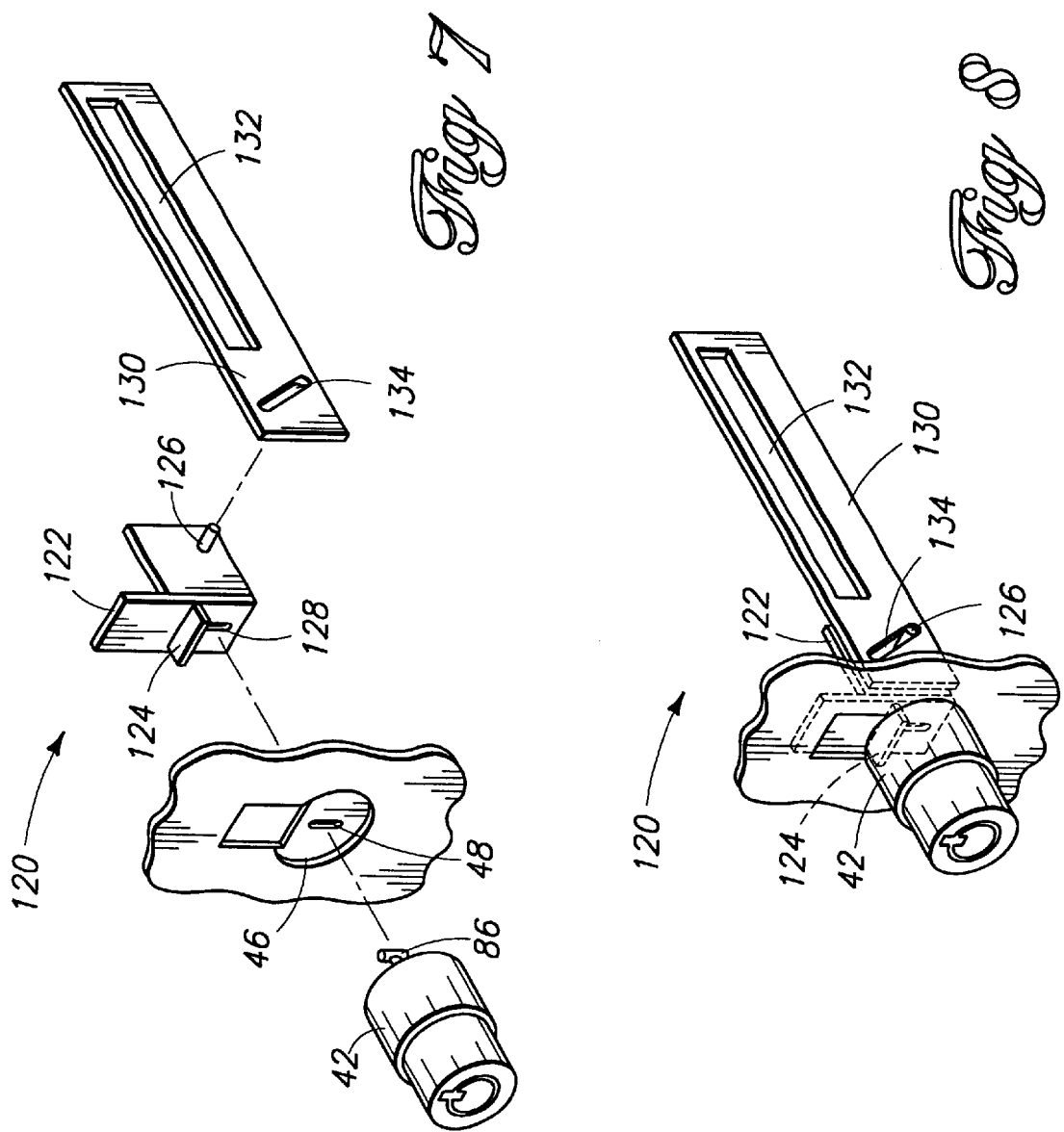

COMPUTER DOCKING STATION WITH ANTI-THEFT LOCKING MECHANISMS FOR REMOVABLE COMPONENTS

TECHNICAL FIELD

This invention relates to computer docking stations. More particularly, this invention relates to mechanisms for locking and preventing theft of components mounted in docking stations and portable computers, such as PC cards, batteries, and memory drives.

BACKGROUND

Portable computers are widely used and a popular alternative to desktop computers. The ability to carry a powerful computing device that offers a full range of processing and communication functionality is very appealing to our mobile generation.

A docking station is a stationary unit that adapts a portable computer for use as a stationary desktop computer. A conventional docking station physically interconnects with the portable computer and provides electronics to interface the portable computer with a set of peripherals, such as a large CRT monitor (e.g., VGA), a normal size or ergonomic keyboard, a mouse, printer, CD-ROM drive, network, and so forth. The docking station resides permanently on the user's desk.

When working at the desk, the user docks the portable computer at the docking station by physically loading the computer onto a docking tray. Once physically mated, the portable computer is electronically interfaced via connectors on the docking station to control the peripherals. In this manner, the portable computer operates as the central processing unit (CPU), with the docking station providing support capabilities for the peripherals. When the user leaves the desk, he/she simply undocks the portable computer from the docking station and carries it along for portable use.

Docking stations range in their sophistication and available extensions to the portable computer. A scaled-down docking station, which is commonly referred to as a "port replicator", merely extends a set of peripheral ports for the docked portable computer. Power might also be directed through a port replicator so that the portable computer need not be manually plugged in before desktop use.

A slightly more sophisticated docking station, which is often referred to as an "enhanced port replicator", offers a similar set of peripherals and additional features, such as an external bus system. An external bus system allows use of expansion cards in conjunction with the portable computer.

More sophisticated stations, often called "full" docking stations or simply "docking stations", offer integrated computer peripherals in addition to peripheral ports and bus systems. For instance, a docking station might include sound peripherals such as speakers, hard disk drives, CD ROM drives, DVD drives, and tape backup systems.

While portability and compact size are appealing qualities in portable computers and docking stations, these very same attributes pose a significant risk of theft. Portable computers and docking stations are easy to steal. While walking off with a desktop PC might garner some questioning looks in the workplace, carrying around a portable computer or docking station may go unnoticed due to the inherent attributes of these devices.

Locks are available to address this problem. One type of lock is a device consisting of a cable or tether that can be secured at one end to a desk or fixture, and at the other end to a computer. Many portable computers and docking stations are equipped with receptacles for mating with such locks.

One particular design is described in U.S. patent application Ser. No. 08/621,419, entitled "Securing Portable Computers and Associated Docking Systems", which was filed on Mar. 25, 1996. This application describes a single tethered locking device that secures both a portable computer and its associated docking station. An opening is formed in the docking station. The opening is sized and positioned so that a Kensington lock can be passed through the opening and locked into a receptacle on the portable computer. In one implementation, placing the Kensington lock through the opening interferes with a computer ejection mechanism in the docking system, and thus prevents a user from attempting to eject the docked computer. In another implementation, attaching the Kensington lock causes a lock extension to engage the receptacle on the portable computer. In either implementation, a single attachment of a Kensington lock secures both the portable computer and its docking station to a desk or other fixture. This application is assigned to Hewlett-Packard Company and is incorporated herein by reference.

While locking devices help prevent theft of the portable computer and docking station, unscrupulous foes have refocused their efforts to stealing parts of the computer system.

One particular target is the PC card. PC cards are small, thin devices about the size of a credit card that insert into portable computers or docking stations to enhance capabilities. PC cards (formerly known as PCMCIA cards) were originally designed to extend memory in portable computers. Today, PC cards are configured to provide many different functions, including memory, modem, network adapter, and so forth. Essentially, PC cards are any type of device that conforms to a standard form factor and pin connect for interfacing with a PC card driver.

Previous locking devices for docking stations and portable computers were not designed to prevent theft of removable components like the PC cards. Accordingly, there remains a need for improved locking mechanisms that not only secure the computers and docking stations, but also prevent theft of PC cards and other removable components.

SUMMARY

A computer docking station has an anti-theft locking mechanism that prevents theft of PC cards and other removable components (removable drives, batteries, etc.) mounted in the docking station and/or a docked portable computer. The locking mechanism is mechanically moveable between locked and unlocked positions. In the locked position, the locking mechanism partially covers the removable components to prevent their removal. In the unlocked position, the locking mechanism exposes the components to allow their removal.

The locking mechanism is. preferably configured for use with an existing tether lock (e.g., a Kensington lock) used to secure the docking station and/or computer. The lock secures the locking mechanism in the locked position.

According to one aspect of the invention, the locking mechanism has a tab and a lock member structurally or mechanically linked to the tab to move in conjunction with the tab. The tab extends partially over the component when in the locked position. The lock member has at least one aperture sized and shaped to receive a lock pin of the lock. When the locking mechanism is moved to the locked position, the aperture of the lock member aligns with a lock receptacle in the docking station or computer to receive the lock pin. In this manner, the same lock used to secure the docking station or computer is also used to lock the locking mechanism over the removable component.

According to another aspect, the docking station (or computer) has a door mounted to alternately expose and cover the component slot. A lock receptacle is formed adjacent the door in the docking station to mate with the lock that secures the docking station to a fixture. A locking mechanism is moveable between locked and unlocked positions. In the locked position, the locking mechanism is positioned relative to the receptacle to be secured by the lock when the lock is mated with the receptacle. In the unlocked position, the locking mechanism is positioned away from the lock receptacle.

According to still another aspect, the docking station is configured with a docking tray to receive the portable computer when docked. The docking station has a security post that projects upward from the docking tray. The security post extends beside the portable computer to prevent removal of a component from the portable computer when the portable computer is docked.

BRIEF DESCRIPTION OF THE DRAWINGS

FIG. 1 is a perspective view of a computer system having a portable computer and a docking station.

FIG. 3 shows a rear perspective of the docking station to illustrate a component locking mechanism according to one implementation.

FIG. 4a shows the locking mechanism in an unlocked position and FIG. 4b shows the locking mechanism in a locked position.

FIG. 5 shows a side perspective of the docking station to illustrate a component locking mechanism according to second implementation.

FIG. 5a shows the locking mechanism in an unlocked position and FIG. 5b shows the locking mechanism in a locked position.

FIG. 7 shows an exploded perspective view of a locking mechanism according to a third implementation.

FIG. 8 shows the locking mechanism of FIG. 7 in an assembled state.

FIG. 9a shows the door locking mechanism in an unlocked position and FIG. 9b shows the door locking mechanism in a locked position.

DETAILED DESCRIPTION

Figure 2A:
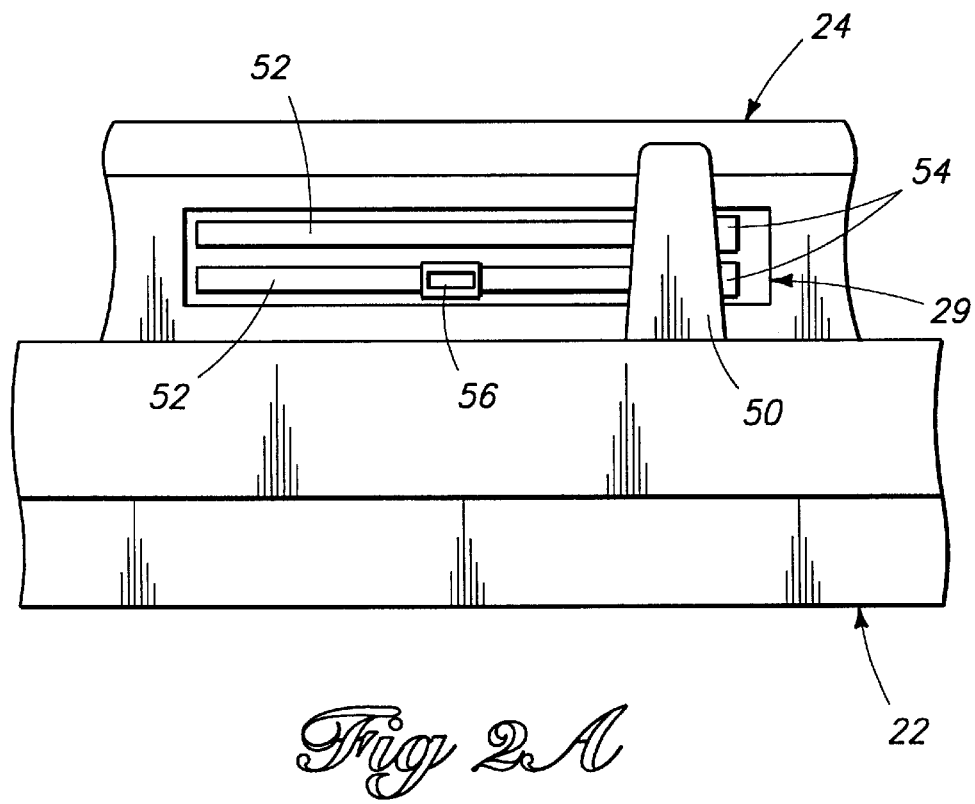
FIGS. 2a and 2b show respective side and top partial cutaway views of a security post mounted on the docking station in proximity of a PC card in the portable computer.

FIG. 1 shows a computer system 20 having a docking station 22 and a portable computer 24. The portable computer 24 is illustrated as a laptop computer having a floppy memory drive 26 exposed on the front, one or more removable batteries 28 mounted in the side, and PC card slots 29 to receive removable PC cards. The PC cards are hidden behind a retractable door or cover that can be retracted to expose the slots and cards.

The docking station 22 is illustrated as a full docking station having a port replicator 30 mounted atop a base 32.

The port replicator 30 has a docking tray 34 that is sized and shaped to receive the portable computer 24. The docking station 22 has an electrical interconnect 36 formed in the replicator 30 to couple to a corresponding interconnect (not shown) on the back of the computer 24. The portable computer 24 can be alternately "docked" to mate physically and electrically with the docking station 22, or "undocked" from the docking station. As the computer is being loaded, it contacts an actuation member 37 that causes a reciprocating locking post 38 to lower, thereby permitting passage of the computer as it docks on the tray. As the computer is loaded farther onto the tray to a full dock position where it mates with the interconnect 36, the locking post 38 reverses direction and raises to engage a corresponding socket in the bottom of the computer 24 to lock the computer in the docked position. A release lever 39 ejects the portable computer 24 from the docking station 22.

The docking station and portable computer can be implemented as other types of computing devices. For instance, the portable computer may be implemented as a laptop computer, notebook computer, sub-notebook computer, hand held computer, or other portable computing devices. The docking station may be implemented as a full station, or as a port replicator, or as a "cradle" which is typically used for small, hand held computers. As used herein, the term "docking station" is intended to broadly apply to various forms of bases ranging from a sophisticated, full docking station having internal processing and electronic components, cable interconnects, and a power supply unit, to an unsophisticated port replicator that simply provides a means to manage cable connections.

The computer system 20 is equipped with several anti-theft locking mechanisms. These locking mechanisms not only prevent theft of the docking station 22 and portable computer 24, but are designed to combat theft of removable components such as PC cards, batteries, and memory drives.

The docking station 22 is secured with a single tethered locking device 40 that utilizes a Kensington lock 42 and a cable or tether 44. The locking device 40 can secure both the docking station 22 and computer 24 to a desk or other fixture. One exemplary locking device is described in the incorporated U.S. patent application Ser. No. 08/621,419, entitled "Securing Portable Computers and Associated Docking Systems", which is referenced in the Background section.

Kensington locks are well known. They have a cylindrical lock barrel, with a key hole in one end and a T-shaped lock pin extending from the opposite end. The T-shaped lock pin has a cylindrical shaft that protrudes from the lock barrel and a cylindrical cross-member formed or attached perpendicularly to the shaft. A pair of pegs jut outwardly from the lock barrel parallel and adjacent to the shaft of the T-shaped lock pin. The pegs remain stationary during locking.

The Kensington lock is attached to a receptacle having an elongated aperture sized and shaped to accept the cross-member of the T-shaped lock pin. Once the pin is inserted into the aperture, turning the key rotates the T-shaped lock pin approximately 90° within the barrel and relative to the stationary pegs. This action rotates the cross-member of the T-shaped lock pin perpendicular to the elongated aperture, thereby securing the Kensington lock to the receptacle.

It is noted, however, that aspects of this invention may be practiced with locks other than a Kensington lock.

According to a first aspect of this invention, the docking station 22 has a security post 50 mounted to project upward from the docking tray 34. The post 50 is physically integrated with the docking station 22 by, for example, being formed of hard plastic integrally with the dock enclosure, or attached to the dock enclosure via screws, glue, or other fixture means. When the portable computer 24 is securely docked in the docking station by the locking post 38, the security post 50 is aligned beside the PC card slots 29.

Figure 2B:
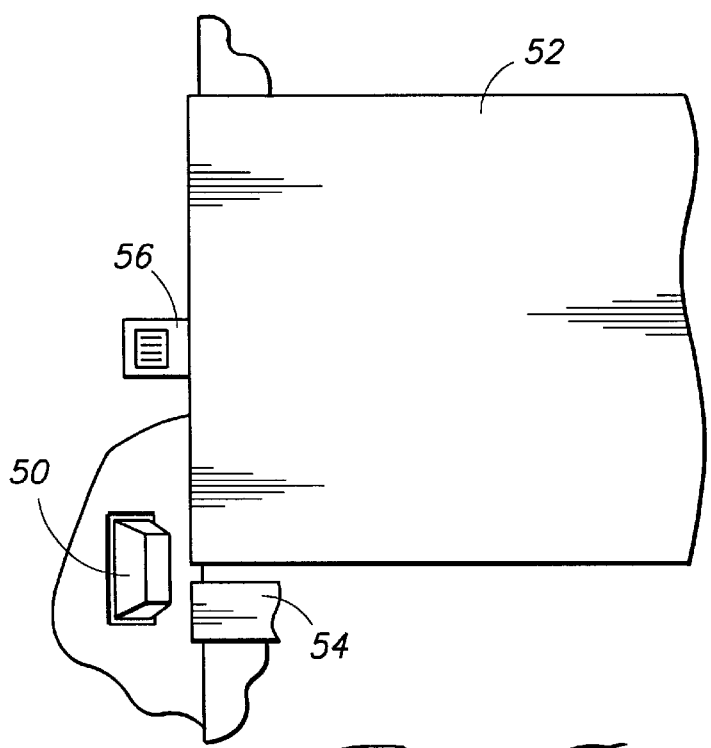

FIGS. 2a and 2b shows the security post 50 juxtaposed to the PC card slots 29. In this illustration, the retractable door to the slots is open, exposing two PC cards 52 mounted in the slots. Card ejection buttons 54 are situated beside the PC cards 52 to eject the cards from their slots. In this example, the bottom PC card 52 is implemented as a modem having a projectable phone plug 56 that extends from the end of the card for connection to a phone cable connector.

The security post 50 is positioned to cover the ejection buttons 54 and portions of the PC cards 52. The security post 50 covers substantially all of the ejection buttons 54 to prevent a person from depressing the buttons and ejecting the PC cards 52. The post 50 covers only part of the PC cards 52 and preferably, just a small edge as shown. In this way, the post does not preclude access to extendible elements like the plug 56, but still prevents a person from manually withdrawing the PC cards from their slots.

Accordingly, the security post 50 prevents theft of PC cards from a docked computer. A thief is prevented from pressing the ejection button 54 and withdrawing the PC card 52, or from manually pulling out the PC card. Although the security post is shown and described as protecting PC cards, it could also be mounted in different positions along the docking tray 34 to cover other removable components of a docked computer, such as the batteries 28 and floppy drive 26 (assuming the floppy drive was mounted on the side, as opposed to the front as shown in FIG. 1).

Apart from the portable computer, the docking station 22 itself might be equipped with removable components, such as PC cards or drives. According to another aspect of this invention, the docking station 22 is equipped with locking mechanisms to prevent their theft.

FIG. 3 shows a rear perspective of docking station 22 with the Kensington locking device (not shown) temporarily detached from its receptacle 46. The receptacle 46 has an elongated opening 48 formed therein to accept the T-shaped lock pin of the Kensington lock.

The docking station 22 has a back panel 58 with several types of connectors, including a mouse port, a keyboard port, a joystick port, a serial port, a printer port, and a display port. The back panel 58 has two PC card slots 60 mounted horizontally side by side. Card ejection buttons 62 (not shown in FIG. 3, but in FIGS. 4a and 4b) are positioned adjacent respective slots 60.

A locking mechanism 70 protects against theft of PC cards when inserted into slots 60. The locking mechanism 70 has two exposed tabs 72 and a lever 74, which are structurally or mechanically linked together inside the enclosure. A user grasps or manipulates the lever 74 to move the locking mechanism 70.

Moving the lever 74 causes the locking mechanism 70 to slide between two positions: a locked position and an unlocked position. In this illustration, the lever 74 is slid leftward to the locked position, causing the tabs 72 to move left and partially cover the PC cards when inserted in slots 60 and to fully cover the ejection buttons. Returning the lever 74 to the right moves the tabs 72 to the unlocked position where the PC cards in slots 60 and the ejection buttons are left uncovered for access to the PC cards.

Figure 4A:
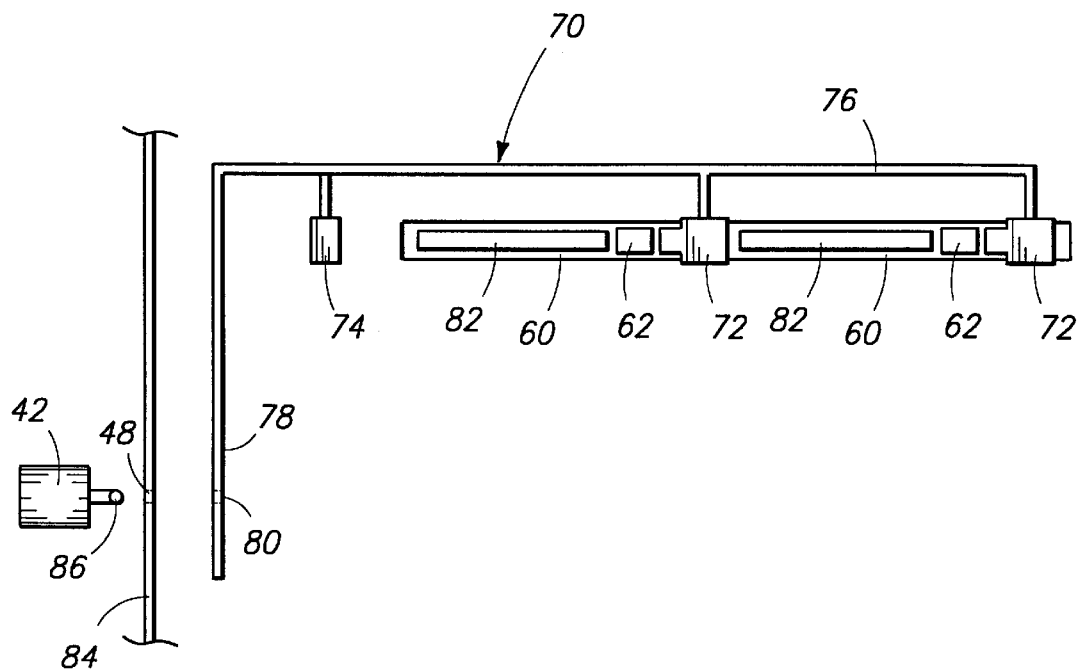
FIGS. 4a and 4b are diagrammatic illustrations of the locking mechanism of FIG. 3.
Figure 4B:
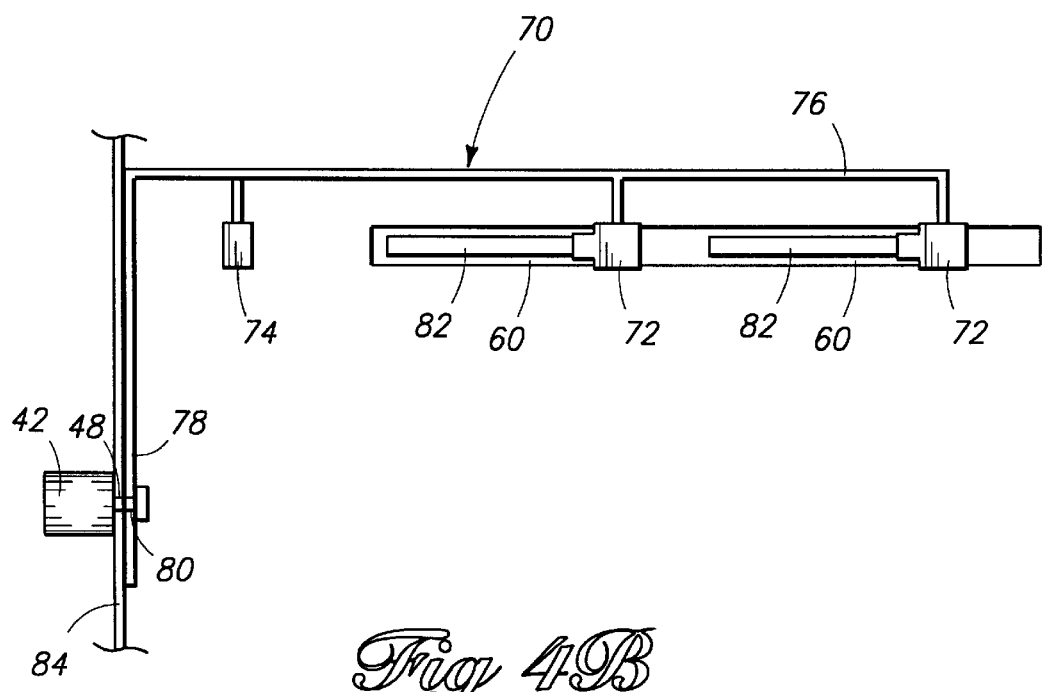

FIGS. 4a and 4b show the locking mechanism 70 in more detail. The tabs 72 and lever 74 are structurally linked via an elongated arm 76. A lock member 78 projects at an angle from the arm 76 and in parallel with an enclosure wall 84 of the docking station. The lock member 78 has an aperture 80 formed therein to compatibly receive a T-shaped pin 86 of the Kensington lock 42. The locking mechanism 70 is moveable as a unit between an unlocked position (FIG. 4a) and a locked position (FIG. 4b).

In the unlocked position (FIG. 4a), the lever 74 is moved to the extreme right and the lock member 78 is spaced from the enclosure wall 84. The tabs 72 uncover the card slots 60 and ejection buttons 62 to allow insertion and removal of PC cards 82. When the Kensington lock 42 is applied to the docking station, the T-shaped pin 86 is inserted into the opening 48 in the enclosure wall 84. The T-shaped pin 86 does not, however, extend through the lock member 78 of the locking mechanism 70.

In the locked position (FIG. 4b), the lever 74 is moved to the extreme left. The tabs 72 partially cover the PC cards 82 in the slots 60 and mostly or fully cover the ejection buttons 62 to block access to and prevent removal of the PC cards 82. The lock member 78 is abutted against the enclosure wall 84 of the docking station so that the aperture 80 aligns with the opening 88 in the enclosure 84. When the Kensington lock 42 is applied to the docking station, the T-shaped pin 86 is inserted into the opening 48 in the enclosure wall 84 and through aperture 80 of the lock member 78. In this manner, the Kensington lock 42 fastens the locking mechanism 70 to the enclosure wall, thereby preventing movement of the locking mechanism 70 back toward the unlocked position.

Although the locking mechanism 70 is described in the context of a docking station, the locking mechanism can be implemented into other types of computing devices, including the portable computer 24.

FIG. 5 shows an alternative implementation of a slidable locking mechanism. In this implementation, a Kensington lock receptacle 46 is mounted beside PC card slots 100. A locking mechanism 110 slides between a locked position, as shown in FIG. 5, and an unlocked position. The locking mechanism 110 has a lever 112 that projects outward to allow a user to grasp it and slide the mechanism. The locking mechanism 110 also has a pair of elongated apertures 114 and 116.

As the locking mechanism 110 is slid between locked and unlocked positions, alternate ones of the apertures 114 and 116 align with the opening (not shown) in the receptacle 46. The Kensington lock can be applied to secure the locking mechanism 110 in either the locked or unlocked position.

Figure 6A:
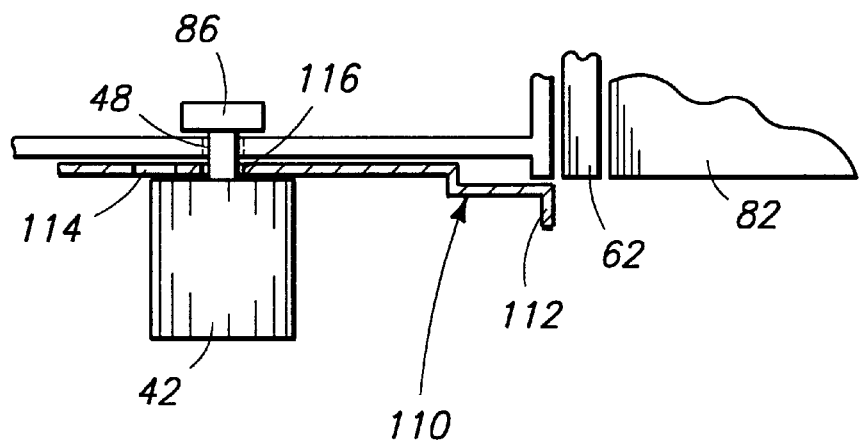
FIGS. 6a and 6b are diagrammatic illustrations of the locking mechanism of FIG. 5.
Figure 6B:
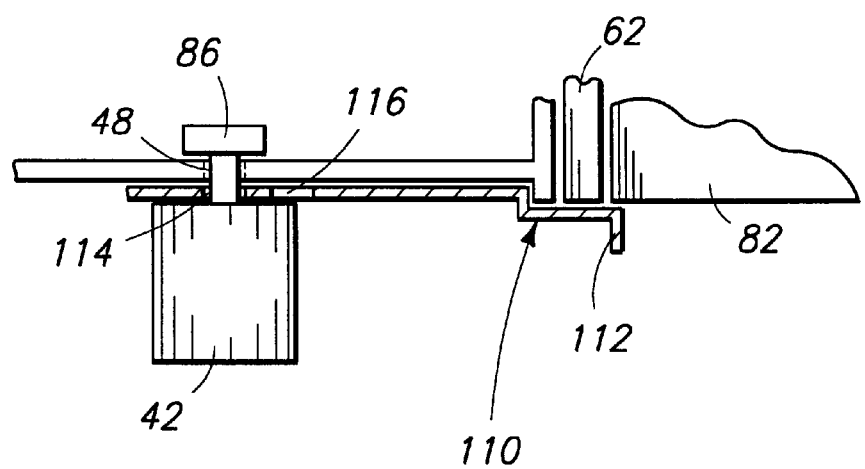

FIGS. 6a and 6b show the two positions of the locking mechanism 110 in more detail. In the unlocked position (FIG. 6a), the lever 112 is moved to the extreme left to withdraw the locking mechanism 110 from in front of the PC card 82 and ejection button 62. The user is free to insert or remove the PC card 82. In this unlocked position, the rightmost aperture 116 is aligned with the receptacle opening 48. The T-shaped lock pin 86 of the Kensington lock 42 is inserted through both the aperture 116 and the opening 48 to secure the locking mechanism 110 in the unlocked position.

In the locked position (FIG. 6b), the lever 112 is moved to the extreme right so that the locking mechanism 110 covers the ejection button 62 and partially covers the PC card 82. This position blocks a person from depressing the button 62 and removing the PC card 82. In the locked position, the leftmost aperture 114 is aligned with the receptacle opening 48. The T-shaped lock pin 86 of the Kensington lock 42 is inserted through both the aperture 114 and the opening 48 to secure the locking mechanism 110 in the locked position.

FIGS. 7 and 8 show another implementation of a slidable locking mechanism. FIG. 7 shows an exploded view of the locking mechanism 120, whereas FIG. 8 shows the mechanism assembled. The locking mechanism 120 has a lock member or switch 122 with a lever 124 and a pin 126. The switch 122 is positioned behind a Kensington lock receptacle 46. The switch 122 has an elongated aperture 128 that aligns with receptacle opening 48 when the mechanism 120 is moved to the locked position.

The locking mechanism 120 also has a moveable plate 130 with a large opening 132 and a cam groove or slot 134. The large opening 132 exposes a PC card slot (not shown) and is large enough to allow insertion and removal of PC cards.

FIG. 8 shows the locking mechanism 120 in the locked position. Here, the lever 124 is down and the aperture 128 is aligned with receptacle opening 48. The switch pin 126 is moved to the bottom of cam slot 134 and the plate 130 is shifted so that plate opening 132 is offset or skewed relative to the PC card slot (not shown). The plate 130 extends partially over the PC card (not shown) and partly or completely over the ejection button (not shown). When the Kensington lock 42 is attached, the T-shaped pin 86 extends through both the opening 46 and aperture 128 to secure the locking mechanism 120 in the locked position. The Kensington lock 42 also covers the lever 124.

When the Kensington lock 42 is removed, the user can move the lever 124 upward to unlock the locking mechanism 120. The switch pin 126 is likewise moved upward relative to the cam slot 134, thereby shifting the plate 130 so that the opening 132 aligns with the PC card slot. As a result, the PC card and ejection button are accessible within the large opening 132.

The locking mechanisms illustrated in FIGS. 3–8 provide an inexpensive and effective approach to preventing theft of PC cards. Additionally, the locking mechanisms do not introduce a new or additional lock, but instead work in conjunction with the existing Kensington lock that is already used to secure the docking station and/or portable computer to a fixture. While the illustrations and detailed description above describe the locking mechanism in the context of protecting PC cards, the locking mechanisms can be used to prevent theft of other removable components, including batteries, memory drives, and so forth.

In the above implementations, the Kensington lock is secured to the port replicator 30 of the docking station 22. It is common for the base 32, mounted beneath the port replicator (see FIG. 1), to have removable components as well. Accordingly, another aspect of this invention is to equip the docking station 22 with locking mechanisms to prevent theft of removable components situated in the base 32.

Figure 9B:
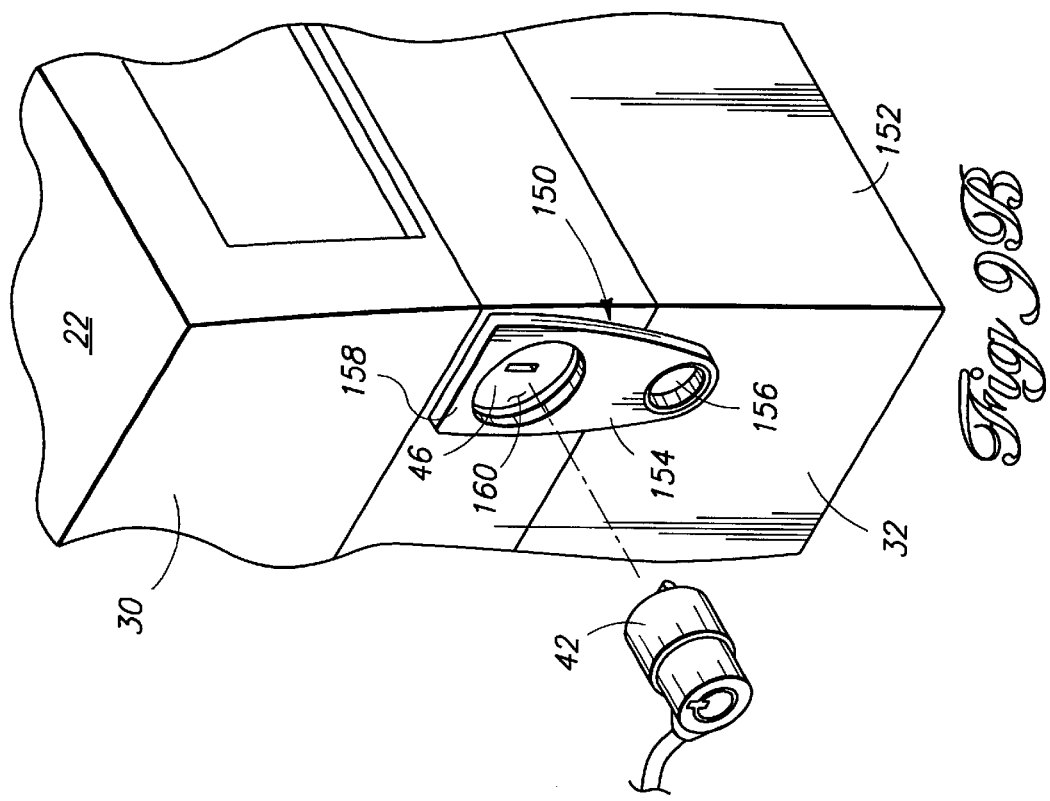
FIGS. 9a and 9b are side perspective views of the docking station showing a door locking mechanism.
Figure 9A:
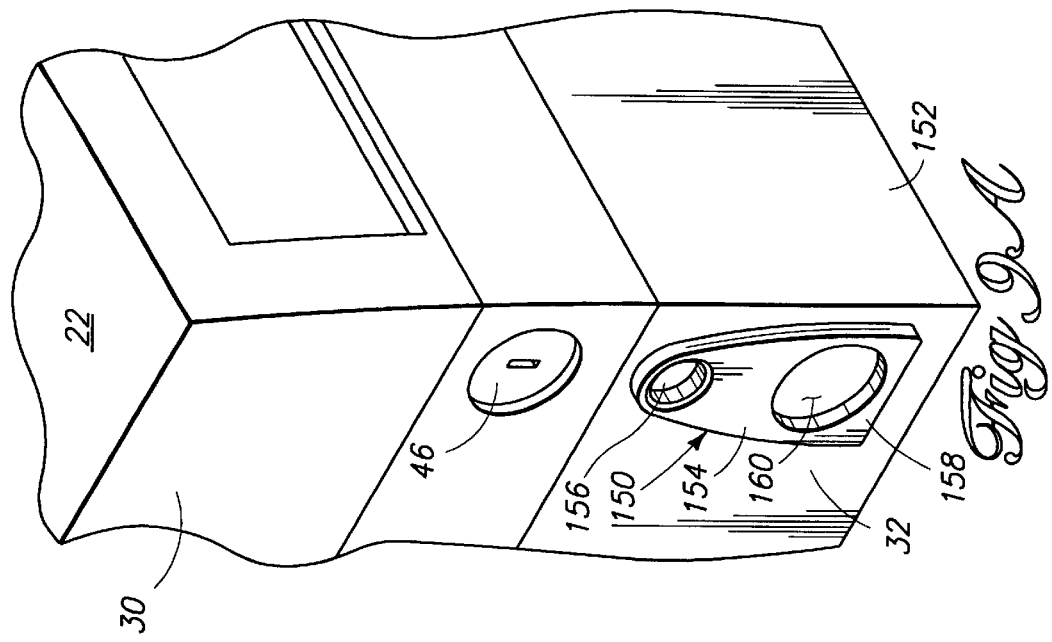

FIGS. 9a and 9b show a base door locking mechanism 150 for locking a door 152 of the base 32. The base door 152 is hingedly mounted to the base 32 to swing between an open position, thereby exposing a removable component therein, and a closed position (which is shown in FIGS. 9a and 9b).

The locking mechanism 150 is pivotally mounted to the door 152 opposite to the hinged end. The locking mechanism 150 has a member 154 with a pivot end 156 mounted to the door 152 and a free end 158 that is rotatable about the pivot end 156. An annular opening 160 is formed in the free end 158.

The locking mechanism 150 is moveable between an unlocked position (FIG. 9a) and a locked position (FIG. 9b). In the unlocked position, the free end 158 of member 154 hangs down below the pivot end 156. A user can open the door 152 to insert or remove components.

To lock the door 152, the user rotates the free end 158 upward so that the opening 160 aligns with the lock receptacle 46 on the port replicator 30, as shown in FIG. 9b. The Kensington lock 42 can then be inserted through the annular opening 160 of the member 154 and secured to the receptacle 46. In this position, the door 152 is locked shut to prevent access to the removable components.

While the locking mechanism 150 is described as having a rotatable member 154, the member may be moved in other ways, such as vertically slid between unlocked and locked positions. Furthermore, the locking mechanism 150 may be adapted for use on other computing devices, including the portable computer.

The locking mechanisms and security posts described herein advantageously thwart theft of removable components from portable computers and docking stations. The mechanisms are low cost and easy to operate. Moreover, the locking mechanisms and posts do not consume a significant amount of space, either internally or externally of the devices, nor are their weights significant. As a result, portable computers and docking stations can be readily adapted to utilize the locking mechanisms and security posts.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A computer docking station comprising:
    a component slot to hold a removable component;
    at locking mechanism mounted to move between an unlocked and a locked position, the locking mechanism covering at least a portion of the component slot when in the locked position to prevent insertion or removal of the removable component, the locking mechanism not covering the component slot when in the unlocked position to allow insertion or removal of the removable component;
    a lock to secure the locking mechanism in the locked position;
    a docking tray to receive a portable computer when docked;
    a fixed security post projecting upward from the docking tray and beside the portable computer to prevent removal of a component from the portable computer when the portable computer is docked; and
    a lever that moves the locking mechanism from the locked to the the unlocked position.

2. A computer docking station as recited in claim 1, wherein the lock also secures the locking mechanism in the unlocked position.

3. A computer docking station as recited in claim 1, wherein the lock comprises a Kensington lock.

4. A computer docking station as recited in claim 1, wherein the locking mechanism comprises a slidable member that slides between the locked and unlocked positions, said slidable member being moved by said lever.

5. A computer docking station as recited in claim 1, wherein the tab extends partially over the component slot in the locked position and does not extend over the component slot in the unlocked position, and wherein;

a lock member linked to the tab to move in conjunction with the tab, the lock member being situated in the locked position to be secured by the lock and being situated in the unlocked position to not be secured by the lock.

6. A computer docking station as recited in claim 5, wherein:

the component slot comprises a PC card to hold a PC card and an the ejector button to eject the PC card from the PC card slot; and the tab is positioned in the locked position substantially over the ejection button and partially over the PC card when the PC card is inserted into the PC card slot.

7. A computer docking station as recited in claim 5, wherein the tab and the lock member are structurally linked in a fixed relationship.

8. A computer docking station as recitedin claim 5, wherein the tab and the lock member are mechanically linked whereby the tab can be moved in one direction while the lock member is moved in another direction.

9. A computer docking station as recited in claim 1, wherein the locking mechanism comprises a pivotal member that pivots between the locked and unlocked positions.

10. A computer docking station, comprising:

a component slot to hold a removable component;

a locking mechanism mountd to move between an unlocked and a locked position by way of a lever that moves the locking mechanism from the locked to the unlocked position, the locking mechanism covering at least a portion of the component slot when in the locked position to prevent insertion or removal of the removable component, the locking mechanism not covering the component slot when the unlocked position to allow insertion or removal of the removable component, and wherein the locking mechanism comprises;

(1) at least one tab that extends partially over the component slot in the locked position and does not extend over the component slot in the unlocked position;

(2) a lock member linked to the tab to move in conjunction with the tab, the lock member being situated in the locked position to be secured by the lock and being situated in the locked position to not be secured by the lock;

a lock to secure the locking mechanism in the locked position, wherein the lock has a lock pin to a compatible receptacle formed in the docking station; and the lock member has at least one aperture formed therein to receive the lock pin so that when the locking mechanism is moved to the locked position, the lock member is adjacent the receptacle and the lock pin can be inerted through the aperture to secure the lock member in the locked position.

11. A computer docking station, comprising:

a component slot to hold a removable component;

a locking mechanism mounted to move between an unlocked position and a locked position, the locking mechanism covering at least a portion of the component slot when in the locked position to prevent insertion or removal of the removable component, the locking mechanism not covering the component slot when in the unlocked position to allow insertion or removal of the removable component, and wherein the locking mechanism comprises:

(1) at least one tab that extends partially over the component slot in the locked position and does not extend over the component slot in the unlocked position;

(2) a lock member linked to the tab to move in conjunction with the tab, the lock member being situated in the locked position to be secured by the lock and being situated in the unlocked position to not be secured by the lock;

a lock to secure the locking mechanism in the locked position, wherein the lock has a lock pin that secures to a compatible receptacle formed in the docking station; and the lock member has first and second apertures formed therein to receive the lock pin so that when the locking mechanism is moved to the locked position, the first aperture of the lock member aligns with the receptacle and the lock pin can be inserted through the first aperture to secure the lock member in the locked position, and when the locking mechanism is moved to the unlocked position, the second aperture of the lock member aligns with the receptacle and the lock pin can be inserted through the second aperture to secure the lock member in the unlocked position.

12. A computer docking station, comprising:

a component slot to hold a removable component;

a locking mechanism mounted to move between an unlocked position and a locked position, the locking mechanism covering at least a portion of the component slot when in the locked position to prevent insertion or removal of the removable component, the locking mechanism not covering the component slot when in the unlocked position to allow insertion or removal of the removable component;

a lock to secure the locking mechanism in the locked position;

wherein the locking mechanism comprises:

a plate with an opening formed therein to allow access to the component slot;

a switch mechanically coupled to the plate so that movement of the switch causes movement of the plate;

wherein movement of the switch to the locked position causes the plate to shift and the opening to be partially offset relative to the component slot, thereby preventing removal of the component; and wherein movement of the switch to the unlocked position causes the plate to shift and the opening to be aligned with the component slot, thereby permitting insertion or removal of the component.

13. A docking station for a portable computer, comprising:

a PC card slot to hold one or more PC cards;

a locking mechanism mounted to move between an unlocked position and a locked position by way of a lever that moves the locking mechanism from the locked to the unlocked position, the locking mechanism having at least one tab that extends partially over the PC card slot in the locked position and does not extend over the PC card slot int he unlocked position, the locking mechanism further having a lock member linked to the tab to move in conjunction with the tab;

a Kensington lock receptacle to receive a lock pin of a Kensington lock; and the lock member of the locking mechanism having at least one aperture formed therein and sized to receive the lock pin so that when the locking mechanism is moved to the locked position, the aperture of the lock member aligns with the Kensington lock receptacle to receive the lock pin of the Kensington lock.

14. A docking station as recited in claim 13, wherein the lock member abuts the Kensington lock receptacle when the locking mechanism is in the locked position, and is spaced from the Kensington lock receptacle when the locking mechanism is in the unlocked position.

15. A docking station as recitedin claim 13, wherein the lock member has first and second apertures formed therein and sized to receive the lock pin so that when the locking mechanism is moved to the locked position, the first aperture of the lock member aligns with the Kensington lock receptacle to receive the lock pin of the Kensington lock to secure the lock member in the locked position, and when the locking mechanism is moved to the unlocked position, the second aperture of the lock member aligns with the Kensington lock receptacle to receive the lock pin of the Kensington lock to secure the lock member in the unlocked position.

16. A docking station as recited in claim 13, wherein the locking mechanism comprises:

a plate with an opening formed therein to allow access to the PC card slot, the plate forming the tab;

the lock member is mechanically coupled to the plate so that movement of the lock member causes movement of the plate;

wherein movement of the lock member to the locked position causes the plate to shift and the opening to be partially offset relative to the PC card slot, thereby preventing removal of the PC card; and wherein the movement of the lock member to the unlocked positioin causes the plate to shift and the opening to be aligned with the PC card slot, thereby permitting insertion or removal of the PC card.

\* \* \* \* \*

UNITED STATES PATENT AND TRADEMARK OFFICE
CERTIFICATE OF CORRECTION

PATENT NO. : 6,331,934 B1
DATED : December 18, 2001
INVENTOR(S) : Jacques H. Helot et al.

It is certified that error appears in the above-identified patent and that said Letters Patent is hereby corrected as shown below:

<u>Title page,</u>
Item [56], References Cited, U.S. PATENT DOCUMENTS, insert the following:
--      5,933,322   *    8/1999      Ruch et al.................361/686
       5,870,283   *    2/1999      Maeda et al...............361/686
       5,555,487   *    9/1996      Katoh et al................361/680
       5,959,835   *    9/1999      Dohi et al..................361/686 --

<u>Column 9,</u>
Line 28, "mountd" should read -- mounted --;
Line 48, "to" should read -- that secures to --;
Line 54, "inerted" should read -- inserted --;

Signed and Sealed this

Eleventh Day of February, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,331,934 B1 Page 1 of 1
DATED : December 18, 2001
INVENTOR(S) : Jacques H. Helot et al.

It is certified that error appears in the above-identified patent and that said Letters Patent is hereby corrected as shown below:

Column 9,
Line 8, delete "recitedin" and insert therefor -- recited in --
Line 28, delete "mountd" and insert therefor -- mounted --
Line 35, after "when" insert -- in --
Line 49, after "pin" insert -- that secures --
Line 55, delete "inerted" and insert therefor -- inserted --

Column 11,
Line 9, delete "recitedin" and insert therefor -- recited in --

Column 12,
Line 15, delete "positioin" and insert therefor -- position --

Signed and Sealed this

Twenty-eighth Day of September, 2004

JON W. DUDAS
*Director of the United States Patent and Trademark Office*